April 21, 1964 J. M. BROWN ETAL 3,130,377

SEMICONDUCTOR INTEGRATED CIRCUIT UTILIZING FIELD-EFFECT TRANSISTORS

Filed May 2, 1960

INVENTORS
Joseph M. Brown &
Arthur D. Evans

BY Stevens, Davis, Miller & Mosher
ATTORNEYS 3,130,377
SEMICONDUCTOR INTEGRATED CIRCUIT UTILIZING FIELD-EFFECT TRANSISTORS

Joseph M. Brown, Richardson, and Arthur D. Evans, Farmers Branch, Tex., assignors to Texas Instruments Incorporated, Dallas, Tex., a corporation of Delaware Filed May 2, 1960, Ser. No. 26,135
10 Claims. (Cl. 331—108)

This invention relates to semiconductor networks and more particularly to such networks which utilize active elements as voltage-variable resistors.

Integrated circuits or semiconductor networks have heretofore been proposed, illustrative of which are those disclosed in an application by Jack S. Kilby, S.N. 791,602, filed February 6, 1959, and entitled "Miniaturized Electronic Circuits and Method of Making." According to that application entire electronic networks are fabricated entirely within tiny wafers of semiconductor material. Various portions of the material act as discrete circuit elements, and other portions of the material serve to make the required internal connections of certain of the circuit elements.

Although the subject matter of the Kilby application constitutes a major breakthrough in the art of circuit miniaturization, and although through its practice any of a wide variety of electronic networks can be formed within a single tiny wafer of semiconductor material, problems have arisen in certain circuit applications. Thus, for example, in some instances it is difficult to form resistors having a sufficiently high value. In other applications it is necessary that a variable resistor be utilized. In such cases, it would be necessary to utilize externally connected components of conventional type to achieve the desired characteristics, thereby reducing to a considerable extent the effectiveness of these networks in achieving true miniaturization of electronic systems.

One example of a circuit in which both of these problems prevail is the novel oscillator of the present invention.

The present invention may be advantageously employed in a variable frequency oscillator utilizing a zero phase shift R-C feedback network. In this circuit, field-effect devices function as voltage controlled resistors to provide either a very high resistance or a variable resistance as required. By utilizing voltage controlled resistors in the R-C feedback network, the frequency of oscillation is caused to vary as a function of the voltage impressed upon the gate of the field-effect device.

An oscillator circuit utilizing the present invention is especially valuable in certain telemetering application. By monitoring the oscillation frequency it is possible to derive an accurate indication of the potential impressed upon the gate electrode. The monitoring operation can be accomplished any number of ways such as utilizing a frequency meter directly connected to the oscillator or, for example, by utilizing the oscillator in a telemetering transmitter to modulate the carrier wave thereby providing the desired information.

It is therefore one object of the present invention to provide a semiconductor network which functions as a variable frequency oscillator.

Another object of the present invention is to provide an active element in a semiconductor network which exhibits variable resistance characteristics.

Still another object of the present invention is to provide a circuit particularly adapted to certain telemetering applications.

A further object is to provide a semiconductor integrated circuit of the type which employs several field-effect devices and/or transistors connected to produce a selected circuit function.

These and other objects of the present invention will become more readily understood as the detailed description of a specific embodiment of the invention unfolds and when taken in conjunction with the accompanying drawings in which.

Figures 1, 2, 3:
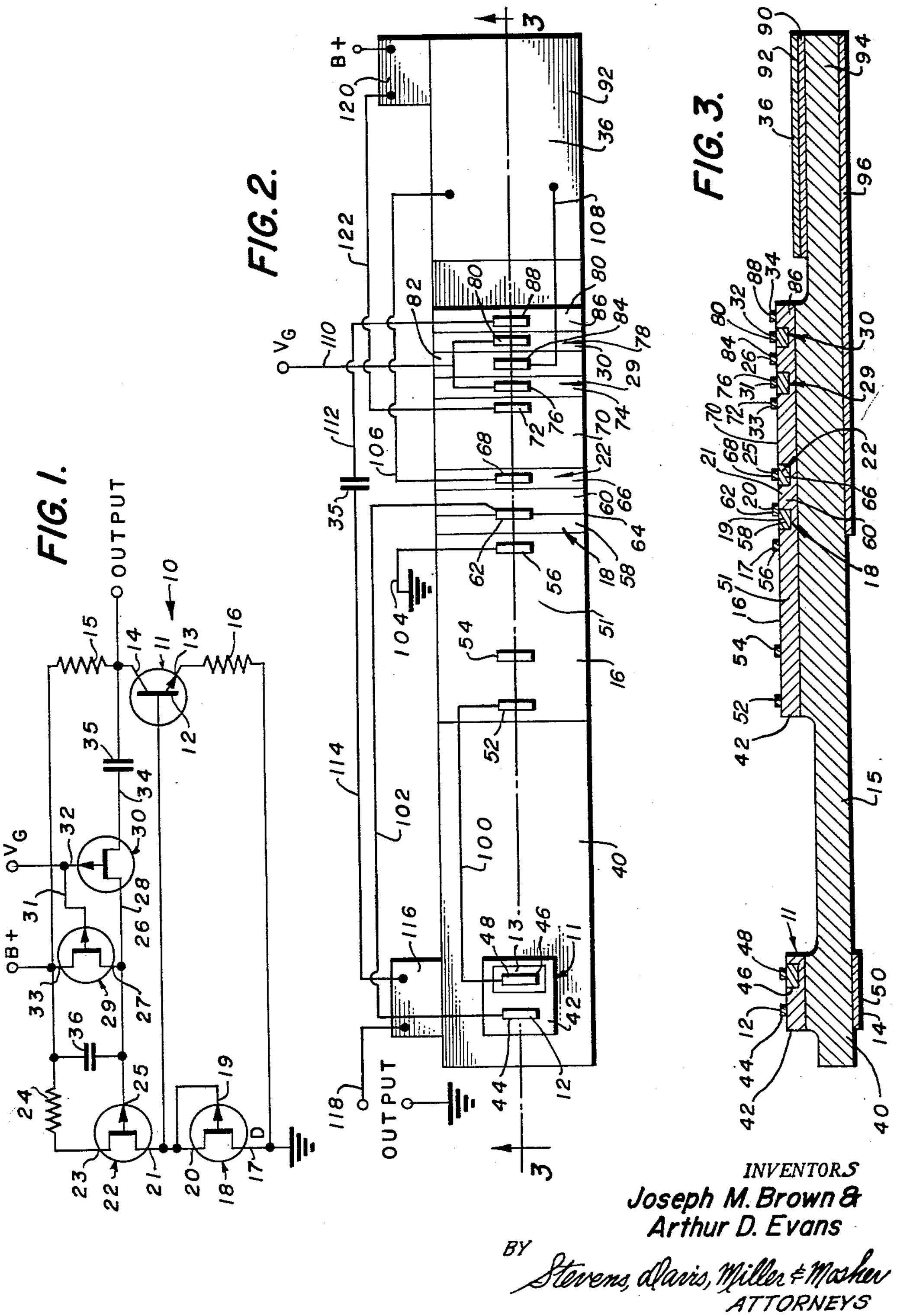
FIGURE 1 is a schematic representation of the novel variable frequency oscillator.
FIGURE 2 is a plan view of a solid semiconductor network fabricated in accordance with the present invention.
FIGURE 3 is a view in cross section along line 3—3 of FIGURE 2.

Referring now to FIGURE 1 of the drawings, reference numeral 10 has been used to designate a variable frequency oscillator utilizing the present invention. The variable frequency oscillator 10 includes a bipolar transistor 11 having the usual base 12, emitter 13 and collector 14. The collector 14 is connected through resistor 15 to the source of positive potential, B+. The emitter 13 of transistor 11 is connected through resistor 16 to the drain 17 of unipolar device 18 which is at ground potential. In addition to the drain 17, the unipolar device 18 includes a gate 19 connected to the source 20 of the device. The source 20 of the device 18 is connected to the base 12 of the bipolar transistor 11. The source 20 of the unipolar device 18 and the base 12 of the bipolar device 11 are connected to the drain 21 of the second unipolar device 22. The second unipolar device 22 has a source 23 connected through resistor 24 to the source of positive potential B+. The gate 25 of unipolar device 22 is connected to point 26. Drain connections 27 and source 28 of unipolar devices 29 and 30, respectively, are also connected to point 26. The gate terminals 31 and 32 of the unipolar devices 29 and 30, respectively, are connected to a source of gate voltage, $V_G$. The source 33 of device 29 is connected to B+. The drain 34 of unipolar device 30 is connected through capacitor 35 to the collector 14 of bipolar device 11. Capacitor 36 is connected between the source and the drain terminals 33 and 27, respectively, of unipolar device 29.

The operation of this particular specific example of the invention will now be described. The unipolar devices 29 and 30 effectively act as resistors, with the value of resistance dependent on the $V_G$ applied to gates 31 and 32 respectively. The unipolar devices 29 and 30, in conjunction with capacitors 35 and 36, form an R-C filter.

Bipolar device 11 is connected to function as a common emitter transistor amplifier whereas the unipolar device 22 is connected to function as an amplifier. The output from the unipolar device 22 is applied to the base 12 of the transistor 11 and will be 180° out of phase with the signal applied to the gate 25 of the unipolar device 22. Similarly, the signal appearing at the collector 14 of transistor 11 will be 180° out of phase with the signal appearing at the base 12 of transistor 11.

The unipolar device 18 is connected to function as a constant current device. The $I_{DO}$, the current required to cause pinch-off in a unipolar device, is less than the $I_{DO}$ of unipolar device 22 by an amount equal to the desired base current to properly bias the bipolar device 11. In this manner, the operation of the circuit is made substantially independent of variations in the power supply voltage. As a constant current device is inherently a very high impedance device, and therefore appears as a virtual open circuit, the load resistor of the unipolar device 22 is effectively the product of the D.C. current gain of bipolar device 11 multiplied by the resistance of resistor 16.

Turning now to FIGURES 2 and 3 of the drawing, a preferred configuration of a novel semiconductor network which performs the function of the circuit of FIGURE 1 is shown. The semiconductor network of FIGURES 2 and 3 can be fabricated utilizing principles set forth in the previously mentioned Kilby application. Thus, it is practical to use a wafer 40 of n-type conductivity silicon having a resistivity of approximately 7 ohm-centimeters. An oxide mask can then be formed on all surfaces of the wafer by placing the wafer in a tube and allowing steam to flow over the wafer.

A layer 42 of p-type conductivity material is formed in the wafer by diffusing gallium or other p-type conductivity impurity material into the wafer. Thereafter, the oxide mask is selectively removed from the surface of the wafer wherever it is desired to diffuse additional n-type conductivity impurity material. The selective removal of the oxide mask is preferably accomplished by utilizing photoresist techniques. After the selective removal of the oxide film, the wafer is subjected to diffusion of an n-type impurity such as phosphorus to form the required emitter and gate regions. It is to be observed that whereas gallium will diffuse through an oxide layer, phosphorus will not and, therefore, these two particular impurities are especially adapted to this technique.

It must be noted that the diffusion depths and concentrations determine the characteristics of the various elements in the circuit and that it may be necessary to repeat the masking and diffusion process several times to produce circuit elements having the desired characteristics.

Once the diffusion processes are complete, the wafer is masked with an etch resistant material such as wax and etched with a suitable etchant to shape the wafer in the manner described in the Kilby application to form the desired resistors, etc. Contacts may be formed by evaporating a material such as nickel onto the desired areas. Capacitors can be formed by laying down an insulating film and then evaporating an electrical contact onto the film.

Referring once more to FIGURES 2 and 3 of the drawing, it is seen that a transistor of mesa type construction is formed at one end of the wafer. It comprises a p-type region 42 having metallized ohmic contact 44 attached thereto. The emitter comprises a diffused n-type region 46 with an ohmic contact 48. Ohmic contact 50 is made to the lower portion of the original n-type material directly underneath the base which serves as a contact for the collector. Regions 42, 46 and the lower portion of the wafer correspond to the base 12, emitter 13, and collector 14 of transistor 11.

A second p-type region 51 functions as resistor 16. Multiple contacts 52 and 54 are provided to allow some choice in the value of resistor used. It is observed that the value of resistance will be determined by the sheet resistance of the p-type layer 51 and the length to width ratio of the p-type region. Contact 56 is a common connection to one end of the resistor 16 formed by region 51 and to the portion of the wafer that functions as the drain of what corresponds to the unipolar device 18. The gate of the unipolar device is formed by the n-type region 58. The p-type region 60 serves as a source for the unipolar device 18 and as the drain for a second region which correspond to unipolar device 22. Metallized contact 62 shorts the junction 64 thereby effectively connecting the gate and source of that portion serving as unipolar device 18.

The n-type region 66 functions as the gate 25 for the second unipolar device 22 with the contact 68 providing the means for making connection thereto. The sheet resistance of p-type region 70 functions as resistor 24. Contact 72 is furnished to provide a means of ohmically contacting one end of the region 70. N-type region 74 with its ohmic contact 76 serves as the gate 31 for the third unipolar device 29. In a similar fashion, the n-type region 78 and ohmic contact 80 serve as the gate for the fourth unipolar device 30. The p-type region 82 with its ohmic contact 84 serves as the drain for the third unipolar device and a source for the fourth unipolar device. The p-type region 86 with ohmic contact 88 functions as the drain for the fourth unipolar device 30.

A capacitor is formed on a depressed portion of the wafer by an oxide film 90 which serves as the dielectric, a metalized portion 92 which serves as one plate, the other plate being formed by that portion 94 of the original material which directly underlies the oxide film.

A large metalized region 96 covers a portion of the underside of the wafer. The sheet resistance of the original n-type material that lies between the collector contact 50 and the large metalized area 96 performs the function of resistor 15.

It is necessary that some circuit connections be made externally. Thus, lead 100 connects the diffused region 46 to one end of the region 51 and lead 102 connects the region 42 to the contact 62. Lead 104 connects contact 56 to ground. Contact 68 is connected to metalized layer 92 via lead 106 while lead 108 is used to connect contact 84 to the same layer 92. Lead 110 is used to connect contacts 76 and 80, respectively, to the source of gate voltage, $V_G$. Lead 112 connects the drain contact 88 to external capacitor 35 and lead 114 connects capacitor 35 to tab 116 which is attached to collector contact 50. The output terminal 118 is also attached to the collector tab 116. Tab 120 is attached to the metalized region 96 in a manner similar to that by which tab 116 is attached to collector contact 50. Lead 122 connects the tab 120 to the contact 72, thereby completing the circuit. It is to be noted that the B+ potential is applied to the tab 120.

The capacitor 35 is shown as an additional element which must be connected to the semiconductor network for it to function properly. It is to be noted that the capacitor 35 can be fabricated on the same piece of semiconductor material in the same manner as the capacitor 36. As such, it would be formed on the lower side of the wafer 40 adjacent the collector tab 50. However, as the capacitor 35 requires a high value of capacitance it has been found more practical to utilize a separate wafer of semiconductor material and, thereafter, to mount the wafers on a common ceramic block and connect as shown.

In addition, for low frequency operation it would be possible to replace many of the external leads shown with small conductors which would be evaporated onto the surface of the wafer over an insulating coating. It has been found, however, that the capacitance produced by these leads would introduce coupling problems at higher operating frequencies.

It must be emphasized here that only a preferred embodiment of this invention has been described above, and that other variations and modifications thereof may be made without departing from the scope of this invention, which is defined in the appended claims.

Thus, for example, although the invention has been described with regard to a zero phase shift oscillator, the principles shown herein would be equally applicable to other phase shift oscillators or other circuit arrangements.

What is claimed is:

1. A zero phase shift oscillator circuit comprising first amplifying means including a semiconductor amplifier device and having input, output and common terminals, second amplifying means including a field-effect device and having input, output and common terminals, means connecting the input terminals of said first amplifying means to the output terminal of said second amplifying means, and a phase shift network coupling the output terminal of said first amplifying means to the input terminal of said second amplifying means, said phase shift network including first capacitance means and first voltage-variable resistance means having a control element connected in parallel between said input and common terminals of said second amplifying means, said phase shift network further including second capacitance means and second voltage-variable resistance means having a control element connected in series between said output terminal of said first amplifying means and said input terminal of said second amplifying means.

2. An oscillator circuit comprising first amplifying means including a semiconductor amplifier device and having an input and an output, second amplifying means including a field-effect device and having input, output and common terminals, means connecting said input of said first amplifying means to said output terminal, and a phase shift network coupling said output of said first amplifying means to said input terminal, said phase shift network including first and second capacitance means and a pair of unipolar transistors each having a control terminal and two other terminals, said other terminals of one of said unipolar transistors shunting said first capacitance means and said input and common terminals, said second capacitance means being connected in series with other terminals of the other of said unipolar transistors and in series between said output of said first amplifying means and said input terminal.

3. A variable-frequency oscillator comprising a transistor having input, output and common electrodes, an output circuit for said transistor including load impedance means and a voltage source connected in series with said output and common electrodes, a first field-effect device having an input circuit and output circuit, said output circuit of said first field-effect device including said input and common electrodes of said transistor and said voltage source, said input circuit of said first field-effect device including said load impedance means, a second field-effect device having a gate terminal and including two other terminals connected across said input circuit of the first field-effect device, a third field-effect device having a gate terminal and including two other terminals connected in series with said input circuit of the first field-effect device, a first capacitor connected across said input circuit of the first field-effect device, a second capacitor connected in series with said input circuit of the first field-effect device.

4. An oscillator circuit comprising a transistor having input, output, and common electrodes, an output circuit for said transistor including load impedance means and a voltage source connected in series with said output and common electrodes, a first field-effect device having input, output and common terminals, a second field-effect device having a gate terminal and two other terminals, said gate terminal being connected to one of said other terminals to provide a constant current device, an output circuit for said first field-effect device including said constant current device and said voltage source connected in series with said output and common terminals, means coupling said output terminal to said input electrode, a third field-effect device having a gate terminal and including two other terminals which are connected across said input and common terminals in shunt with a first capacitor, a fourth field-effect device having a gate terminal and including two other terminals which are connected in series with a second capacitor between said output electrode and said input terminal.

5. A semiconductor network for use in an oscillator circuit comprising a wafer of single crystal semiconductor material, the major bulk of said wafer being of one conductivity type, a first region of said wafer including portions of alternate conductivity types and defining a transistor, a second region of said wafer connecting said first region to a third region, said second region defining a resistor, said third region comprising a surface layer of the opposite conductivity type defined in said wafer, a first portion of said third region defining a resistor, a second portion of said third region defining a first pair of unipolar transistor devices having a common electrode, integrally-connected portions of said second portion being the channels for said first pair of devices, a third portion of said third region connecting said second portion to a fourth portion, said third portion of said third region defining a resistor, said fourth portion defining a second pair of unipolar transistor devices having a common electrode, integrally-connected portions of said fourth portion being the channels for said second pair of devices, and a capacitor formed on a fourth region of said wafer and connected to said third region.

6. In a semiconductor network, a body of single crystal semiconductor material, a first region of one conductivity type defined in said body, a second region of the opposite conductivity type defined in said body contiguous to said first region, a third region and a fourth region defined in said body contiguous to said second region and spaced from said first region, said third and fourth regions being separated from one another by a portion of said second region, first conductive means contacting said first region closely adjacent said second region, second conductive means contacting said first region and spaced from said first conductive means by an amount substantially greater than the spacing between said second region and said first conductive means, third conductive means contacting said third region and said portion in common, fourth conductive means contacting said fourth region, and fifth conductive means contacting said second region adjacent said third region on the side removed from said fourth region.

7. In a semiconductor network, a body of single crystal semiconductor material, a first region of one conductivity type defined in said body, a second region of the opposite conductivity type defined in said body adjacent the surface thereof and contiguous to said first region, a third region and a fourth region of said one conductivity type defined in said body adjacent the surface thereof contiguous to said second region and spaced from said first region, said third and fourth regions being spaced from one another by a portion of said second region, said portion being connected to the remainder of said second region only by thin channels underlying said third and fourth regions, first conductive means contacting said first region, second conductive means contacting said second region, third conductive means contacting said third region, and fourth conductive means contacting a surface area of said body including exposed edges of said fourth region and said portion of said second region.

8. In a semiconductor integrated circuit formed in a wafer of single crystal semiconductor material:

(*a*) a first and second field-effect device defined in the wafer by thin layers of semiconductor material of alternate conductivity types closely adjacent one major face of the wafer, each field-effect device occupying only a limited portion of the area of said one major face, each field-effect device having a channel and a gate, the channels of the first and second field-effect devices being electrically connected in series with one another, the gate of the first field-effect device being electrically shunted to an end of the channel thereof;

(*b*) a minority-carrier-type transistor defined in the wafer by thin layers of semiconductor material of laternate conductivity types closely adjacent said one major face, the transistor being spaced away from the pair of field-effect devices along said one major face and occupying only a limited portion of the area of said one major face, the transistor having a base, an emitter and a collector;

(*c*) means including contacts adherent to the surface of the wafer for applying operating bias potential across the emitter and collector of said transistor and for applying varying potential to the gate of the second field-effect device;

(*d*) and means electrically connecting the base of the transistor to a point intermediate the series-connected channels of the first and second field-effect devices.

9. In a semiconductor integrated circuit formed in a wafer of single crystal semiconductor material:

(*a*) first and second field-effect transistors defined in the wafer by thin layers of semiconductor material of opposite conductivity types closely adjacent one major face of the wafer, the field-effect transistors being spaced from one another along the major face with each occupying only a limited portion of the area of said one major face, each field-effect transistor having a gate and a channel;

(*b*) means for electrically connecting the channels of said first and second transistors in series with one another and across a supply source;

(*c*) means including a contact adherent to said one major face of the wafer for connecting the gate of the first field-effect transistor to the channel thereof;

(*d*) and means including a contact adherent to said one major face of the wafer for applying signal potential to the gate of said second field-effect transistor.

10. In an integrated semiconductor device of the type formed in a wafer of single crystal semiconductor material:

(*a*) a shallow region adjacent a major face of the wafer composed of semiconductor material of a conductivity-type opposite that immediately underlying said shallow region, the shallow region occupying only a limited part of the total surface area of said one major face;

(*b*) a pair of surface regions composed of semiconductor material of conductivity-type opposite that of the shallow region defined in said shallow region at spaced-apart locations to divide the shallow region into first, second and third portions, the first and second portions being connected within the wafer only by a thin channel underlying one of the surface regions and the second and third portions being connected within the wafer only by another thin channel underlying the other of the surface regions;

(*c*) means including contacts adherent to said one major face of the wafer on said first and third portions for applying operating bias thereacross;

(*d*) a conductive film adherent to said one major face of the wafer overlying parts of the second portion and said one of the surface regions;

(*e*) and means including a contact adherent to said one major face of the wafer on said other of the surface regions for applying signals thereto.

References Cited in the file of this patent

UNITED STATES PATENTS

| | | |
|---|---|---|
| 2,648,805 | Spenke et al. | Aug. 11, 1953 |
| 2,816,228 | Johnson | Dec. 10, 1957 |
| 2,894,221 | Coy | July 7, 1959 |
| 2,897,295 | Zelinka | July 28, 1959 |
| 2,967,277 | Hahnel | Jan. 3, 1961 |
| 3,035,186 | Doucette | May 15, 1962 |